(12) United States Patent
Sakata et al.

(10) Patent No.: US 6,933,216 B2
(45) Date of Patent: Aug. 23, 2005

(54) FINE PARTICLE FILM FORMING APPARATUS AND METHOD AND SEMICONDUCTOR DEVICE AND MANUFACTURING METHOD FOR THE SAME

(75) Inventors: Atsuko Sakata, Yokohama (JP); Keiichi Sasaki, Yokohama (JP); Nobuo Hayasaka, Yokosuka (JP); Katsuya Okumura, Yokohama (JP); Hirotaka Nishino, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 168 days.

(21) Appl. No.: 10/314,364

(22) Filed: Dec. 9, 2002

(65) Prior Publication Data

US 2003/0122252 A1 Jul. 3, 2003

Related U.S. Application Data

(62) Division of application No. 09/449,941, filed on Nov. 29, 1999, now Pat. No. 6,538,323.

(30) Foreign Application Priority Data

Nov. 30, 1998 (JP) .......................................... 10-340264

(51) Int. Cl.⁷ .............................................. H01L 21/20
(52) U.S. Cl. ...................... 438/584; 438/613; 438/666; 438/674; 438/676
(58) Field of Search ................................ 427/128, 180, 427/191, 598; 438/584, 586, 592, 597, 598, 610, 613, 666, 674, 676

(56) References Cited

U.S. PATENT DOCUMENTS

| | | | |
|---|---|---|---|
| 5,147,413 A | 9/1992 | Kiovsky et al. | |
| 5,324,552 A | 6/1994 | Opower et al. | |
| 5,529,634 A | 6/1996 | Miyata et al. | |
| 5,629,564 A | 5/1997 | Nye, II et al. | |
| 5,631,499 A | 5/1997 | Hosomi et al. | |
| 5,648,686 A | 7/1997 | Hirano et al. | |
| 5,864,178 A | 1/1999 | Yamada et al. | |
| 5,903,058 A | 5/1999 | Akram | |
| 5,912,510 A | 6/1999 | Hwang et al. | |
| 5,925,931 A | 7/1999 | Yamamoto | |
| 5,943,597 A | 8/1999 | Kleffner et al. | |
| 5,959,363 A | 9/1999 | Yamada et al. | |
| 5,962,918 A | 10/1999 | Kimura | |
| 5,998,861 A | 12/1999 | Hiruta | |
| 6,008,543 A | 12/1999 | Iwabuchi | |
| 6,028,357 A | 2/2000 | Moriyama | |
| 6,051,450 A | 4/2000 | Ohsawa et al. | |
| 6,111,317 A | 8/2000 | Okada et al. | |
| 6,111,321 A | 8/2000 | Agarwala | |
| 6,127,736 A | 10/2000 | Akram | |

FOREIGN PATENT DOCUMENTS

| | | | |
|---|---|---|---|
| JP | 5-47771 | | 2/1993 |
| JP | 6-280002 | | 10/1994 |
| JP | 10183328 | * | 7/1998 |

OTHER PUBLICATIONS

IBM Technical Disclosure, "Premagnetizing Magnetic Data," Oct. 1, 1985.*

* cited by examiner

Primary Examiner—Asok Kumar Sarkar
(74) Attorney, Agent, or Firm—Finnegan, Henderson, Farabow, Garrett & Dunner, L.L.P.

(57) ABSTRACT

After a barrier film is formed on a pad electrode, Ni particles having a diameter of 2 μm or less are selectively deposited on the barrier film, thereby forming a Ni fine particle film. Then, a bump electrode made of a solder ball is provided on the pad electrode through the Ni fine particle film. Thereafter, the bump electrode is melted by a heat treatment to join the Ni fine particle film to the bump electrode. Thus, a bump electrode structure is finished.

7 Claims, 12 Drawing Sheets

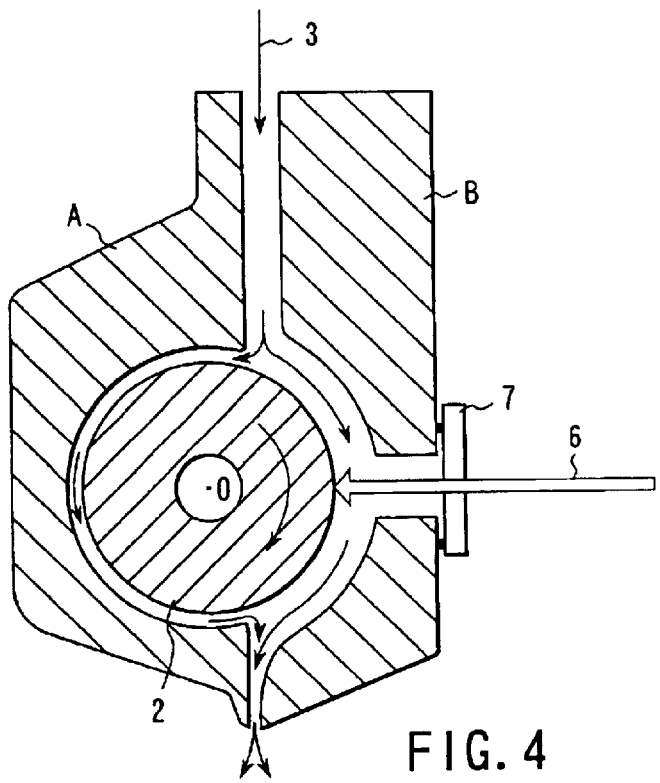
FIG. 3
FIG. 4
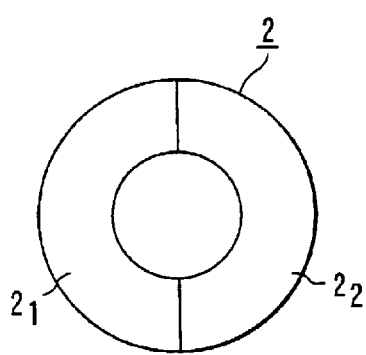
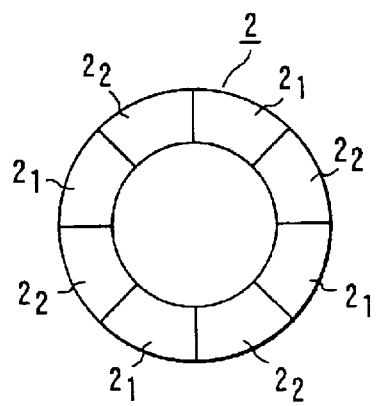
FIG. 5A
FIG. 5B

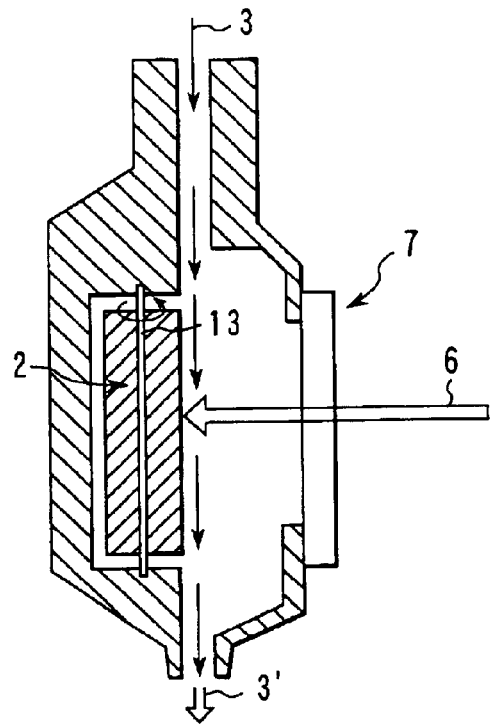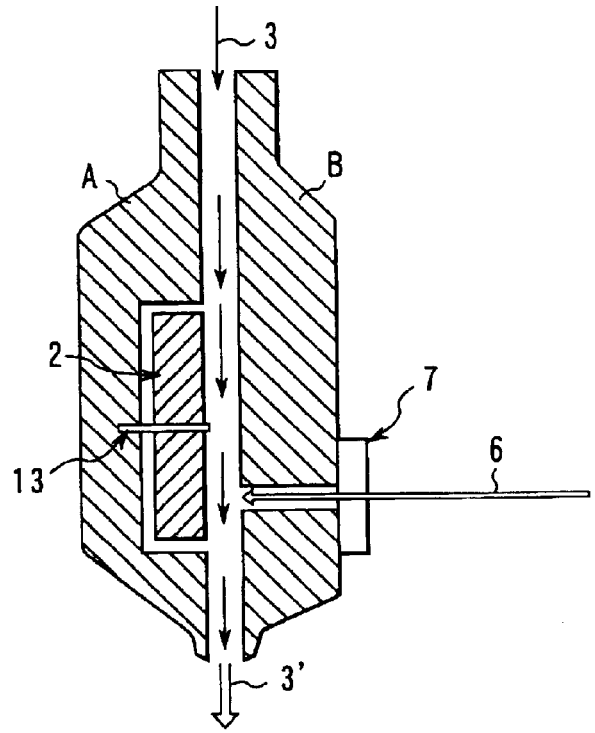
FIG. 6A
FIG. 6B
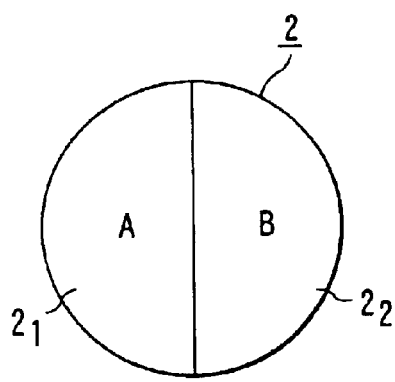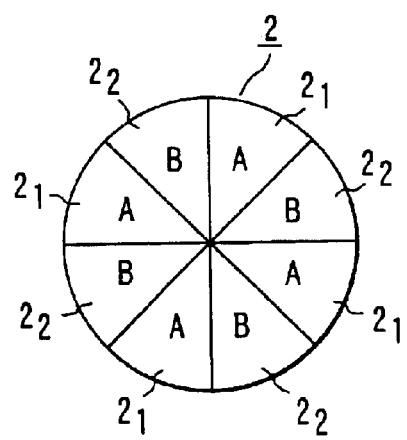
FIG. 7A
FIG. 7B

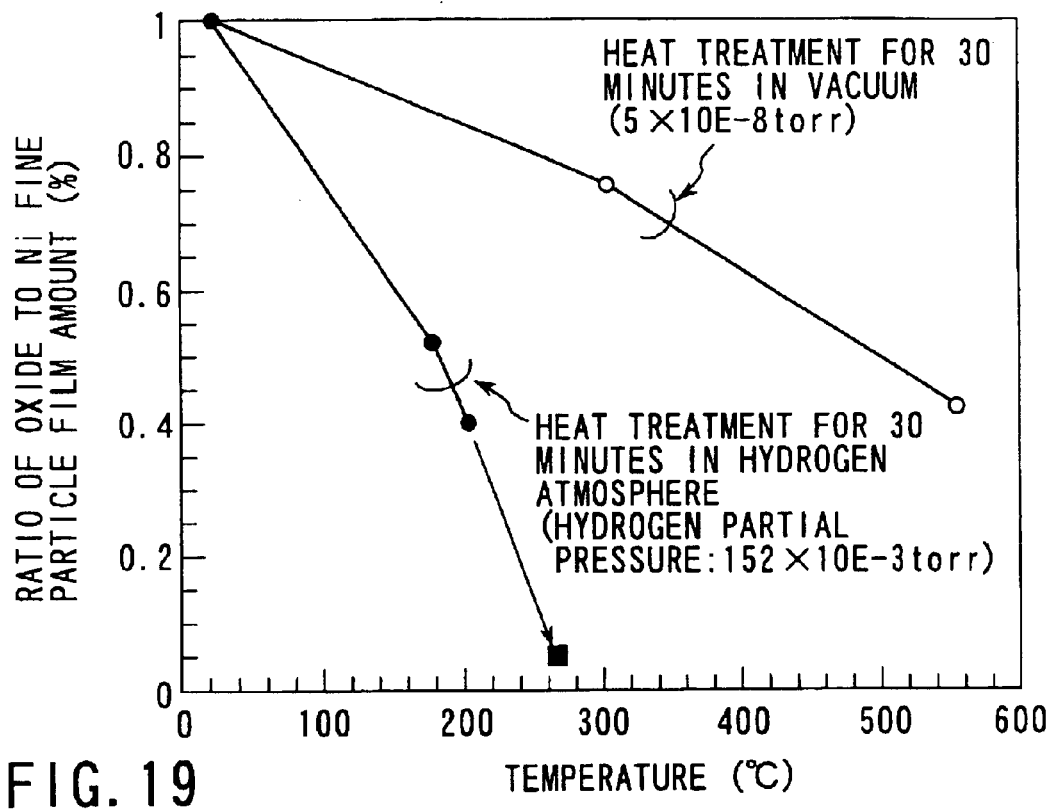
FIG. 19
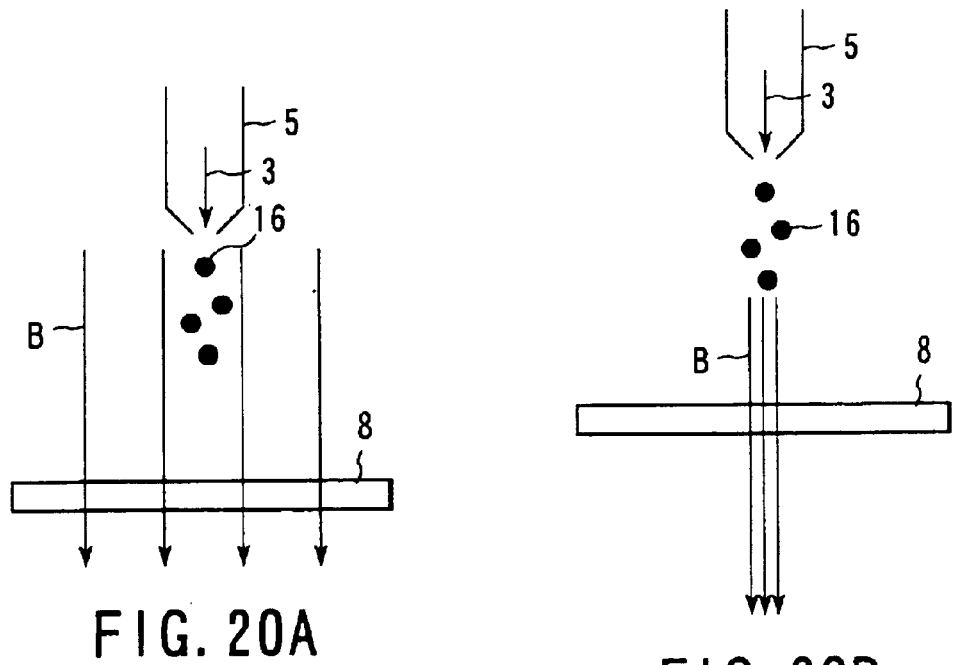
FIG. 20A
FIG. 20B

FINE PARTICLE FILM FORMING APPARATUS AND METHOD AND SEMICONDUCTOR DEVICE AND MANUFACTURING METHOD FOR THE SAME

Divisional Application under 37 C.F.R. §1.53(b) of prior application Ser. No. 09/449,941 filed Nov. 29, 1994, now U.S. Pat. No. 6,538,323 of, Atsuko SAKATA, Keiichi SASAKI, Nobuo HAYASAKA, Katsuya OKUMURA, and Hirotaka NISHINO for FINE PARTICLE FILM FORMING APPARATUS AND METHOD AND SEMICONDUCTOR DEVICE AND MANUFACTURING METHOD FOR THE SAME.

BACKGROUND OF THE INVENTION

In order to connect an integrated circuit formed in an element region of a semiconductor substrate to a circuit (an external circuit) provided on the outside of the substrate, a pad electrode has been formed in a non-element region in the peripheral edge portion of the semiconductor substrate. The pad electrode is electrically connected to the integrated circuit, and furthermore, is electrically connected to the external circuit through a lead.

The connection of the pad electrode and the lead is performed through a bump (projection) electrode. This kind of bump electrode has conventionally been formed by electrolytic plating such as gold, solder and the like.

FIGS. 18A to 18E are sectional views showing steps of a method for forming a bump electrode according to the prior art. In order to form the bump electrode, first of all, a plurality of pad electrodes 83 (only one of them is shown in the drawing) made of Al are formed in a non-element region covered with an insulating film 82 in the peripheral edge portion of a semiconductor substrate 81 as shown in FIG. 18A.

More specifically, for example, an Al film is formed by using a sputtering method, and the Al film is then processed by photolithography and RIE, thereby forming the pad electrode 83. The pad electrode 83 is electrically connected to a semiconductor device constituting an integrated circuit (not shown) which is formed on the semiconductor substrate 81.

As shown in FIG. 18A, next, an interlayer dielectric film 84 is formed over the whole surface of the semiconductor substrate 81, and the interlayer dielectric film 84 provided on the pad electrode 83 is then removed selectively by etching, thereby forming an opening.

As shown in FIG. 18A, then, a Ti film 85, a Ni film 86, and a Pd film 87, which are conductive films necessary for electrolytic plating, are sequentially formed by using the sputtering method, for example, so as to cover the exposed pad electrode 83 and the interlayer dielectric film 84.

The Ti film 85 is a barrier film of a bump electrode material, the Ni film 86 is a contact film to perform a contact of the pad electrode 83 with the bump electrode, and the Pd film 87 is an oxidation inhibiting film for inhibiting the oxidation of the Ni film 86.

As shown in FIG. 18B, thereafter, a photoresist pattern 88 is formed. The photoresist pattern 88 has a thickness of about 20 μm and is provided with an opening in a region where the bump electrode is to be formed.

As shown in FIG. 18C, subsequently, the films 85 to 87 are electrically charged by a current-carrying pin to perform the electrolytic plating, for example. Thus, a bump electrode 89 made of gold or solder is selectively formed in the opening. In this case, it is necessary to previously cover, with an insulator, a region which should not be subjected to the electrolytic plating, for example, the back side of the semiconductor substrate 81.

As shown in FIG. 18D, next, the photoresist pattern 88 is taken away, and the films 85 to 87 are then subjected to wet etching by using the bump electrode 89 as a mask. Thus, the films 85 to 87 are caused to remain under the bump electrode 89, thereby insulating the bump electrodes.

As shown in FIG. 18E, finally, the bump electrode 89 is subjected to reflow by performing heating while applying a flux.

However, such a method for forming the bump electrode 89 has the following drawbacks.

First of all, the electrolytic plating is used for the formation of the bump electrode 89. The electrolytic plating requires a large number of steps. For this reason, there is a problem in that the number of steps is large.

At a wet etching step for the various films 85 to 87 which have been subjected to the sputtering prior to the plating, a wet etching step and a washing step should be performed several times according to the kind of the film, and a vast amount of water is required.

Recently, the pad electrode 83 has also been formed more finely with an increase in the fineness of the element. Therefore, there are some cases where an antireflection film such as a TiN film to prevent reflection during exposure at a lithography step is formed on an Al film acting as the pad electrode 83.

Although the TiN film is effective as a barrier metal, it has poor adhesion to the bump electrode made of metal such as solder, gold or the like. For this reason, after the Al film is processed to form the pad electrode 82, the TiN film should be removed. Consequently, the number of steps tends to be increased still more.

Moreover, a resist pattern to be used at the etching step which is an ordinary semiconductor process has a thickness of several μm, while the resist pattern 88 to be used at the plating step has a great thickness of 20 μm as described above. For this reason, there is a problem in that the photolithography step for forming the resist pattern 88 will be hard to perform in the future.

Moreover, in the case where a semiconductor device having the resist pattern 88 formed therein is immersed in a strongly acidic plating bath, the resist pattern 88 is eluted as an organic impurity into the plating bath at the electrolytic plating step so that the composition balance of a plating solution is lost.

As a result, a variation in the reflow reaction temperature of the bump electrode 89 is generated at a reflow step of the bump electrode 89 and a mounting connection step thereof. Consequently, there is a problem in that the reliability and yield of the connection is deteriorated.

By the high functionality of the element and various mounting steps, a reduction in the size of the pad electrode and an increase in the number of the pad electrodes are accelerated. Therefore, a reduction in the above-mentioned variation will be increasingly significant in the future in order to keep the reliability of the pad electrode 89.

In order to eliminate the above-mentioned drawbacks, there has been known a method in which a metallic ball such as a solder ball, a gold ball or the like is provided on an Al pad electrode and is then pressure welded and melted to form a bump electrode.

However, in the case where the solder ball is provided on the Al electrode pad, a barrier film and an adhesion layer are to be formed in order to prevent Sn constituting the solder ball from being diffused into the Al electrode pad. In this respect, the number of steps is increased in the same manner as in plating film formation.

As one of metal film forming methods, a fine particle film forming method has been known and application to a part of the method to a process has been investigated. As a method for application to a mounting technique, there has been investigated a method for forming a bump electrode made of fine particles of gold (Au) by depositing the Au fine particles on a pad electrode.

In the case of this method, it is necessary to deposit a large quantity of Au fine particles in order to form a bump electrode having a required thickness. Under the existing conditions, however, a deposition rate or the like is insufficient. Therefore, there is a problem in that such a method does not correspond to a real process. In other words, there has not been a real electrode structure using a conductive fine particle film.

BRIEF SUMMARY OF THE INVENTION

It is an object of the present invention to provide a semiconductor substrate having a real electrode structure using a conductive fine particle film and a method for manufacturing the semiconductor substrate, and a fine particle film forming apparatus and method which is effective in the formation of a fine particle film such as a conductive fine particle film.

The present invention provides a fine particle film forming apparatus comprising a vessel having a gas inlet for introducing a gas therein provided on one of ends thereof and having a gas blow-off nozzle for blowing off a gas containing fine particles to an outside provided on the other end thereof, a gas flow forming portion for forming a constant gas flow in the vessel from the gas inlet toward the gas blow-off nozzle, a target provided in the vessel for acting as a fine particle source, a fine particle generating portion for irradiating light on a main surface of the target, thereby discharging a component of the target into the gas flow to form the fine particles made of the component in the gas flow, and a moving portion for moving the vessel.

Preferably, the moving portion can cause the gas blow-off nozzle and the surface of the substrate where the fine particles are formed to be positioned at a desirable interval, thereby relatively moving the vessel with respect to the substrate. Furthermore, it is preferable that the magnetic forming portion for forming a magnetic field in the region on the substrate should be provided. A magnetic field may be formed in the region on the substrate and other regions. In short, it is sufficient that the magnetic field can affect the formation of the fine particle film.

Moreover, the present invention provides a method for forming a fine particle film, comprising the steps of preparing a target as a fine particle source, irradiating light on a main surface of the target, thereby discharging a component of the target to an outside, forming fine particles from the discharged component, and carrying the fine particles on a gas flow to a surface of a substrate, thereby forming a fine particle film made of the fine particles on the substrate.

Furthermore, the present invention provides another method for forming a fine particle film, comprising the steps of preparing a substrate, and supplying a gas or medium containing fine particles having a magnetism to the substrate and forming a magnetic field on the substrate, thereby forming a fine particle film on the substrate.

It is desirable that the magnetic field should be formed in the vicinity of the region on the substrate. The magnetic field can also be formed in the vicinity of the region on the substrate and other regions. In short, it is sufficient that the magnetic field can affect the formation of the fine particle film. More specifically, it is sufficient that a distribution of the magnetic field is controlled, thereby increasing an acceleration of the gas or medium in a direction of the substrate. The increase in the acceleration means at least one of an increase in the speed of the gas or medium and an increase in the amount of the gas or medium running at the same speed in the direction of the substrate.

The present invention provides a semiconductor device comprising a semiconductor substrate, and an electrode structure provided on the semiconductor substrate and constituted by a first electrode provided on the semiconductor substrate, a conductive fine particle film provided on the first electrode and made of conductive fine particles, and a second electrode provided on the conductive fine particle film.

Moreover the present invention provides another semiconductor device comprising a semiconductor substrate, and an electrode structure provided on the semiconductor substrate and constituted by a first electrode provided on the semiconductor substrate, a barrier film provided on the first electrode, a conductive fine particle film provided on the barrier film and made of conductive fine particles, and a second electrode provided on the conductive fine particle film.

Furthermore, the present invention provides yet another semiconductor device comprising a semiconductor substrate, and a bump electrode structure provided on the semiconductor substrate and constituted by a first electrode provided on the semiconductor substrate, a conductive fine particle film acting as a barrier film and an adhesion layer which is provided on the first electrode and is made of conductive fine particles, and a second electrode provided on the conductive fine particle film.

The present invention provides a method for manufacturing a semiconductor device comprising the steps of forming a pad electrode on a semiconductor substrate, forming an insulating film on the semiconductor substrate on a side where the pad electrode is formed, removing the insulating film provided on the pad electrode, thereby forming, on the insulating film, an opening reaching the pad electrode, forming, on a bottom of the opening, a conductive fine particle film as an adhesion layer and a barrier film that is made of conductive fine particles, providing a bump electrode on the conductive fine particle film, and joining the bump electrode to the conductive fine particle film.

The present invention provides another method for manufacturing a semiconductor device comprising the steps of forming, on a semiconductor substrate, a pad electrode having a top face covered with a barrier film, forming an insulating film on the semiconductor substrate on a side where the pad electrode is formed, removing the insulating film provided on the barrier film, thereby forming, on the insulating film, an opening reaching the barrier film, forming, on a bottom of the opening, a conductive fine particle film as an adhesion layer that is made of conductive fine particles, providing a bump electrode on the conductive fine particle film, and joining the bump electrode to the conductive fine particle film.

The present invention provides yet another method for manufacturing a semiconductor device comprising the steps of forming a pad electrode on a semiconductor substrate, forming an insulating film on the semiconductor substrate on a side where the pad electrode is formed, removing the insulating film provided on the pad electrode, thereby forming, on the insulating film, an opening reaching the pad electrode, forming a barrier film on a whole surface of the substrate on a side where the opening is formed, forming, on the barrier film in the opening, a conductive fine particle film as an adhesion layer which is made of conductive fine particles, providing a bump electrode on the conductive fine particle film, joining the bump electrode to the conductive fine particle film, and removing the barrier film on an outside of the opening.

It is preferable that the method for manufacturing a semiconductor device should further comprise the step of removing a natural oxide film formed on the conductive fine particle film or a natural oxide film formed on the conductive fine particle film and the bump electrode.

The natural oxide film formed on the conductive fine particle film may be removed during or after the formation of the conductive fine particle film or during and after the formation of the conductive fine particle film.

Moreover, the conductive fine particle film and the natural oxide film of the bump electrode may be removed at separate steps respectively or may be removed at the same time.

Furthermore, the natural oxide film is removed by a heat treatment (a heating treatment), for example.

More specifically, the removal is carried out by the heat treatment in a vacuum atmosphere, an inactive gas atmosphere, a reducing gas atmosphere, or a gas atmosphere containing $H_2$ and a flux. Examples of other removing methods include a method using a reverse sputtering method.

Similarly, it is preferable that the natural oxide film formed on the pad electrode, the barrier film or both of them should be removed.

The natural oxide film formed on the pad electrode and the barrier film may be removed before or during the formation of the conductive fine particle film, or before and during the formation of the conductive fine particle film. Moreover, the same removing method as that of the conductive fine particle film is used, for example.

According to the present invention the conductive fine particle film is not used for the electrode but is utilized as the contact film and the barrier film to be inserted between the electrodes. Since such films are much thinner than the electrode, they do not make troubles on a deposition rate but correspond to a real process. Accordingly, it is possible to implement a real electrode structure using the conductive fine particle film.

According to the present invention furthermore, the fine particles can selectively be deposited more easily in the predetermined region. Therefore, the fine particle film can selectively be formed easily in the predetermined region. According to the present invention therefore, it is possible to prevent the number of steps from being increased when forming the electrode structure according to the present invention.

According to the present invention moreover, the kinetic energy of the fine particles colliding with the substrate can be increased by utilizing the magnetic field. As a result, it is possible to form fine particles film having a higher density.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a view showing a variant of a target of the fine particle film forming apparatus;

FIG. 4 is a sectional view showing a main part (a fine particle exhaust nozzle) of a fine particle film forming apparatus according to a second embodiment of the present invention;

FIGS. 5A and 5B are plan views showing an annular target comprising first and second targets made of different materials from each other;

FIGS. 6A and 6B are sectional views showing a variant of the fine particle exhaust nozzle according to the second embodiment;

FIGS. 7A and 7B are views showing a target to be used for the fine particle exhaust nozzle;

FIG. 19 is a chart showing a temperature dependency in a heat treating atmosphere of the amount of Ni nitride for a Ni fine particle film; and FIGS. 20A and 20B are views illustrating a method for forming a Ni fine particle film having a high density utilizing a magnetic field.

DETAILED DESCRIPTION OF THE INVENTION

Preferred embodiments of the present invention will be described below with reference to the drawings.

First Embodiment

Figure 1:
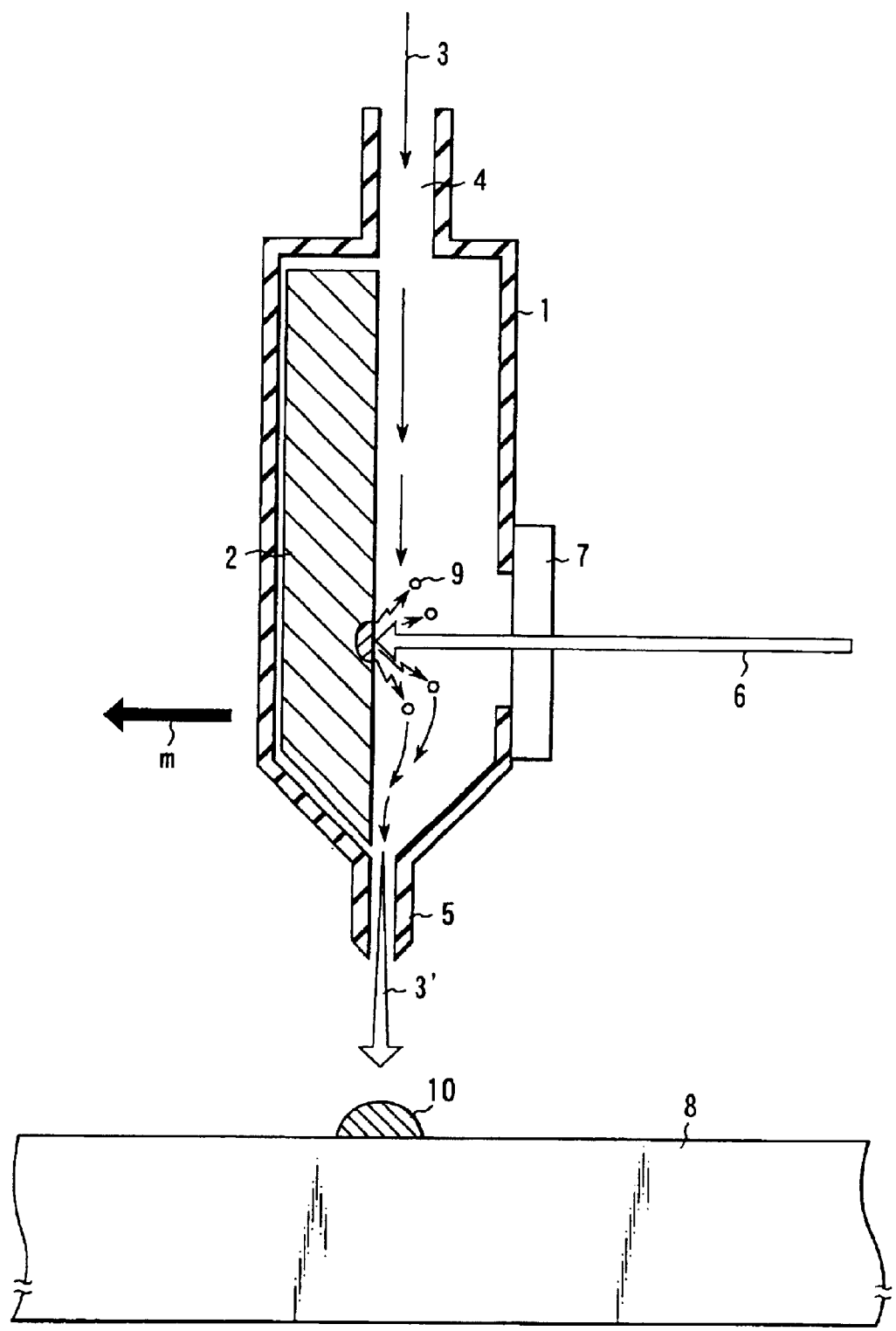
FIG. 1 is a sectional view showing a main part (a fine particle exhaust nozzle) of a fine particle film forming apparatus according to a first embodiment of the present invention.

FIG. 1 is a sectional view showing a main part (a fine particle exhaust nozzle) of a fine particle film forming apparatus according to a first embodiment of the present invention. The fine particle film forming apparatus according to the present embodiment is broadly divided into the fine particle exhaust nozzle shown in FIG. 1, a carrier gas supply source which is not shown, an external light source which is not shown, and moving means of the fine particle exhaust nozzle which is not shown.

In the drawing, the reference numeral 1 denotes a vessel. A target 2 acting as a fine particle source is provided in the vessel 1. The target 2 is held on the internal wall of the vessel 1. More specifically, the main surface of the target 2 is held in parallel with a direction of a gas flow fed in the vessel 1.

One of ends of the vessel 1 is provided with a gas inlet 4 for introducing a carrier gas 3 and the other end of the vessel 1 is provided with a gas blow-off nozzle 5 for blowing off the carrier gas 3 containing fine particles to the outside.

An external light source which is not shown is provided on the outside of the vessel 1, and a light 6 emitted from the external source is irradiated on the main surface of the target 2 through an optical window 7 provided on the side wall of the vessel 1.

Next, a method for forming fine particles using the fine particle film forming apparatus having such a structure will be described.

First of all, the carrier gas 3 is introduced from the gas inlet 4, thereby forming a constant gas flow along the main surface of the target 2. The carrier gas 3 flowing over the surface of the target 2 is blown off from the gas blow-off nozzle 5 and is irradiated on the surface of a wafer (or substrate) 8. In a state of such a gas flow, the light 6 is irradiated on the surface of the target 2 from the external light source through the optical window 7.

At this time, the light intensity of the light 6 is properly selected, thereby evaporating or ablating a component (target material) 9 from the surface of the target 2 to discharge the target material 9 into the gas flow. The configuration of the target material 9 is an atom, a molecule or a particle.

Furthermore, a pressure in the vessel 1 is relatively raised, thereby causing the target material 9 discharged into a gas phase by the evaporation or the ablation to collide with the carrier gas 3 to lose the kinetic energy of the target material 9. Thus, aggregation of the target materials is caused to form fine particles made of the target material 9.

The fine particles are carried by the gas flow of the carrier gas 3. The carrier gas 3 containing the fine particles is blown off from the gas flow-off nozzle 5, and is sprained on the surface of the wafer 8. Thus, the fine particles are deposited to form a fine particle film 10.

The light 6 is continuously or intermittently irradiated on the main surface of the target 2 while moving the vessel 1 in a direction of an arrow m shown in the drawing by means of moving means which is not shown. Consequently, a line-shaped or spot-shaped fine particle film 10 can be formed on the wafer 8.

Figure 2:
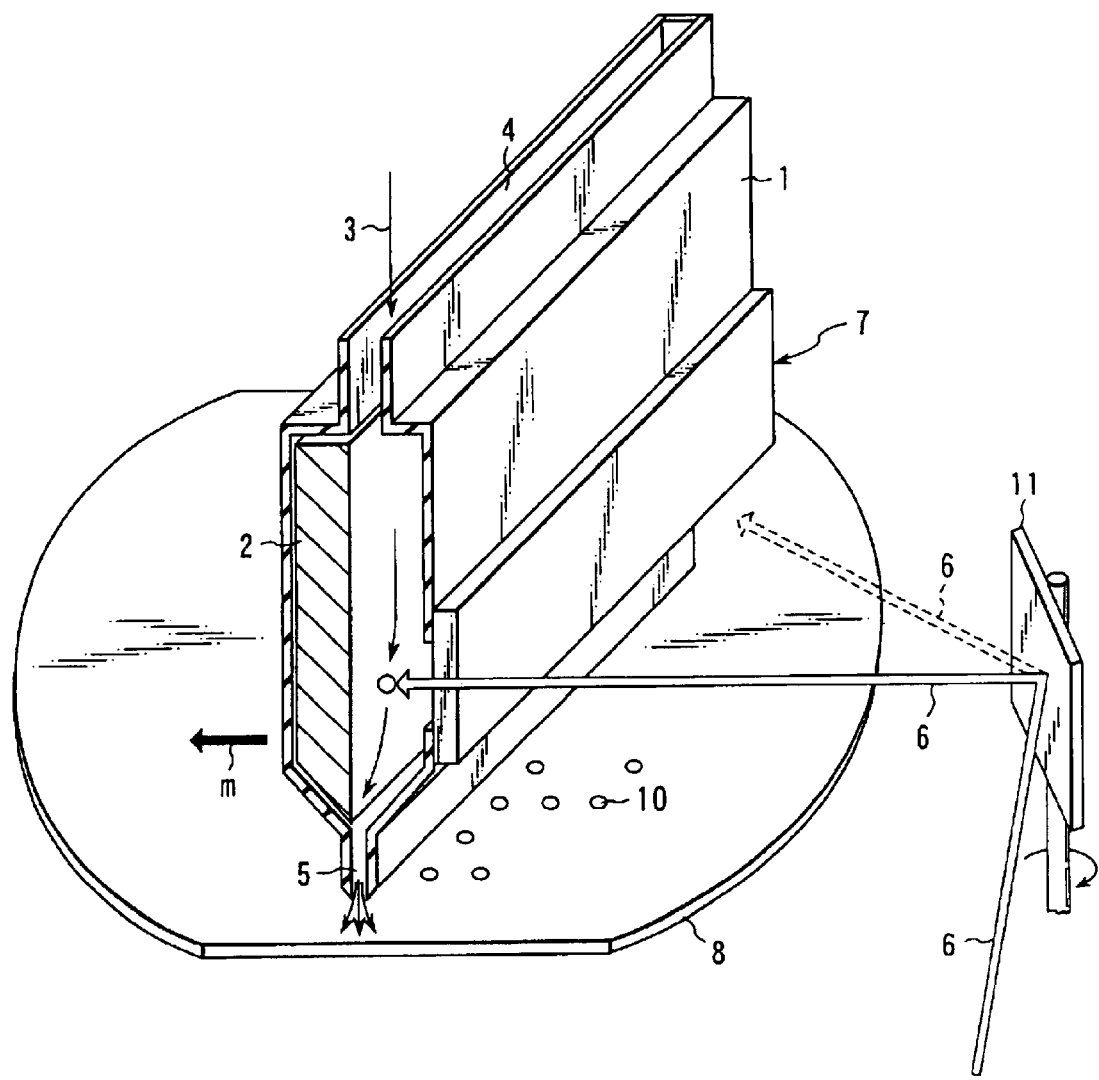
FIG. 2 is a view showing a more specific structure of the fine particle film forming apparatus.

FIG. 2 shows a more specific structure of the fine particle film forming apparatus. The fine particle exhaust nozzle is shown in a sectional perspective view.

Herein, a laser beam source is used as the external light source. The light (laser beam) 6 emitted from the laser beam source is reflected by a rotating mirror 11 and is then irradiated on the surface of the target 2 through the optical window 7.

By controlling the rotating angle of the rotating mirror 11, the laser beam 6 can be irradiated like a spot in a desired position on the main surface of the target 2. For this reason, in the case where the fine particle exhaust nozzle is fixed, the fine particles are deposited like a spot on the surface of the wafer 8 positioned under a laser beam irradiating portion so that the spot-shaped fine particle film 10 is formed.

Accordingly, the fine particle film 10 having an optional pattern can be formed on the wafer 8 by controlling the irradiating timing of the laser beam 6, the irradiating time thereof, and the movement (scan) of the fine particle exhaust nozzle.

Next, description will be given to an example in which a fine particle film is actually formed by using the fine particle film forming apparatus according to the present embodiment.

Ni was used as the target material, and KrF excimer laser (having a wavelength of 248 nm) was used as the light to be irradiated.

A laser spot diameter was 100 $\mu m\phi$ on a target surface, a laser power was 1 to 10 $J/cm^2$, and a laser pulse width was about 10 nsec.

An Ar gas is used as the carrier gas 3, which has a flow rate to generate a constant gas flow. A higher pressure than a pressure on the outside provided with the wafer was kept in the vessel 1. The gas exhaust nozzle 5 was a slit-shaped, and had an opening width of 100 $\mu m$ and a length of 50 mm. Fused quartz was used for the optical window 7.

The fine particle film is formed as follows. First of all, the fine particle exhaust nozzle was fixed to irradiate the laser beam 6 on a plurality of places over the surface of the target 2. Next, the fine particle exhaust nozzle was moved by a constant distance and was then fixed again to irradiate the laser beam 6 on a plurality of places over the main surface of the target 2.

As a result, as shown in FIG. 2, the fine particle film 10 formed by depositing the fine particles like a spot could be arranged on the wafer 8. Moreover, the spot size of the fine particle film 10 can be set to 100 to 200 $\mu m\phi$ by controlling the flow rate of the gas.

The present embodiment can variously be changed in the following manner. For example, while Ni has been used as the target material in the present embodiment, various materials such as metals, alloys, semiconductors and insulators can be used by selecting a proper laser power.

Moreover, while the Ar gas has been used as the carrier gas 3 in the present embodiment, a gas having a high reactivity can also be used. For example, a $SiO_2$ film can be formed by using Si as the target material and an oxygen gas as the carrier gas 3. Furthermore, a silicon nitride film can also be formed by introducing a nitrogen gas. By such a method, a film such as metals, oxide of semiconductors, nitride or the like can also be formed.

Furthermore, although Ni has been used as the target material in any portion in the present embodiment, a lamination film having different materials can be formed by using other target materials 12a and 12b on the upstream and the downstream in the flow direction of the gas and shaking the laser beam 6 vertically to alternately irradiate the laser beam 6.

Moreover, while the rotating mirror 10 has been used for controlling the irradiation position of the laser beam 6 in the present embodiment, the control may be performed by other methods.

Furthermore, although the KrF excimer laser beam has been used as the laser beam 6 in the present embodiment, other laser beams may be used. For example, fundamental waves of a $CO_2$ laser and a YAG laser, harmonics thereof and the like or a laser beam in a longer wavelength region (from an infrared region to a ultraviolet region) can be used. Moreover, while the pulse laser beam has been used in the present embodiment, a continuous (CW) laser beam may be used.

Second Embodiment

FIG. 4 is a sectional view showing a main part (a fine particle exhaust nozzle) of a fine particle film forming apparatus according to a second embodiment of the present invention. FIG. 4 is a sectional view in which the fine particle exhaust nozzle is seen from above. Corresponding portions to the fine particle exhaust nozzle in FIG. 1 have the same reference numerals as in FIG. 1 and their detailed description will be omitted.

In the present embodiment, a cylindrical target 2 is used. The cylindrical target 2 is held in a vessel 1 eccentrically from the side (a region A) on which the laser beam 6 is irradiated toward the opposite side (a region B).

As a result, a conductance between the vessel 1 in the region A and the target 2 is greater than that between the vessel 1 in the region B and the target 2, and the gas flow of the carrier gas 3 is mainly formed on the laser beam irradiation side. Consequently, a target material discharged into a vapor phase by evaporation or ablation can be blown off more efficiently toward the surface of a wafer.

FIGS. 5A and 5B are plan views showing an annular target 2 comprising first and second targets $2_1$ and $2_2$ made of different materials from each other.

As shown in FIG. 5A, in the case where the target 2 is divided into two portions, a half of the target 2 being formed by the first target $2_1$ and the other half being formed by the second target $2_2$, a fine particle film having two lamination films can be formed by irradiating a laser beam on the target material $2_1$ ($2_2$) for a constant period and then irradiating the laser beam on the target material $2_1$ ($2_2$) for a constant period.

Moreover, a fine particle film (a mixed film) obtained by mixing different materials from each other can be formed by rotating the target 2 at a high speed. Furthermore, a fine particle film can be formed in the shape of an alloy film by rotating the target 2 at a high speed and controlling a temperature in the vessel 1.

As shown in FIG. 5B, furthermore, the target 2 is divided into more portions, and the first target $2_1$ and the second target $2_2$ are alternately formed. Consequently, a lamination film, a mixed film and an alloy film which have more uniform qualities can be formed.

Besides, the number of the targets made of different materials from each other is not always two but may be three or more. By increasing the number of the targets made of different materials, it is possible to form a lamination film, a mixed film and an alloy film which are made of various materials. Furthermore, a division ratio is not always equal.

FIGS. 6A and 6B are sectional views showing a fine particle exhaust nozzle according to a variant of the present embodiment. In FIG. 6A, a rotary shaft is different from the rotary shaft of the cylindrical target 2 shown in FIG. 4. In FIG. 6B, a disc-shaped target 2 is used. With such a device structure, the same effects can also be obtained. FIG. 7 is a view corresponding to FIG. 5. FIG. 7 is a plan view seen in parallel with the rotary shaft 13 of the target 2 in the structure of the device illustration in FIG. 6.

Third Embodiment

FIGS. 8A to 8E are sectional views showing the steps of a method for forming a pad electrode of a semiconductor device according to a third embodiment of the present invention.

Figure 8A:
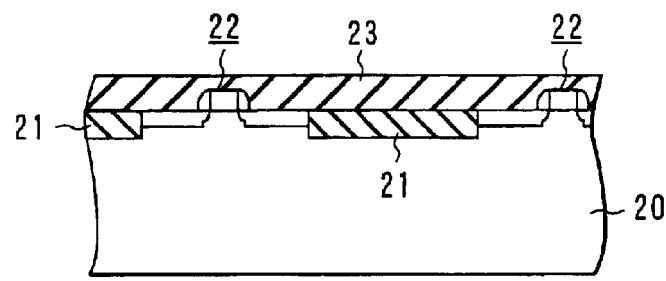
FIGS. 8A to 8E are sectional views showing the steps of a method for forming a pad electrode of a semiconductor device according to a third embodiment of the present invention.

First of all, as shown in FIG. 8A, an interlayer dielectric film 23 is formed on a semiconductor substrate 20 where an element such as a MOS transistor is formed. In the drawing, the reference numeral 21 denotes an element isolation film and the reference numeral 22 denotes a MOS transistor having an LDD structure.

Figure 8B:
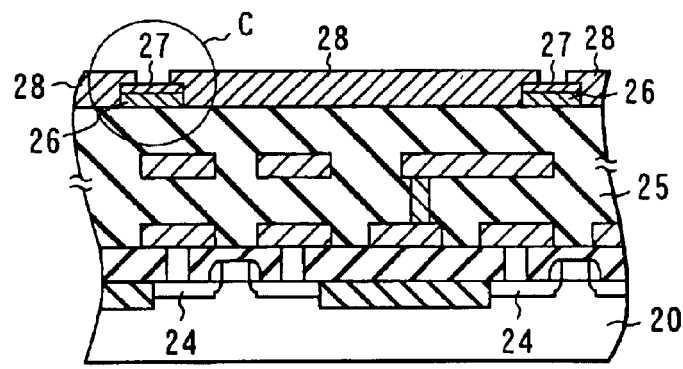

As shown in FIG. 8B, next, a source/drain electrode and a multilayer interconnection are formed according to a known method. In the drawing, the reference numeral 25 denotes an interlayer dielectric film. Portions in the interlayer dielectric film 25 which are shown in different oblique lines denote wiring of the multilayer interconnection or a connecting plug.

As shown in FIG. 8B, subsequently, a pad electrode 26 made of Al which is covered with a barrier film 27 having a surface made of TiN is formed on the semiconductor substrate 20. The materials of the barrier film 27 and the pad electrode 26 are not restricted to TiN and Al, respectively.

The barrier film 27 and the pad electrode 26 are formed in the following manner, for example.

First of all, an Al film acting as the pad electrode 26 and a TiN film acting as the barrier film 27 are sequentially formed on the interlayer dielectric film 25. Then, the TiN film and the Al film are processed by using lithography and RIE. Thus, the pad electrode 26 and the barrier film 27 are formed. At this time, the TiN film serves as an antireflection film at the lithography step.

In the case where a thin (damascene type) pad electrode is to be formed, a liner film such as a TiN film for covering the internal face of a trench is formed, and an Al film and the barrier film 27 are then formed. While the case of the pad electrode has been described above, the same effects can be obtained in the case where a substrate is a wiring.

As shown in FIG. 8B, next, a protective insulating film 28 is deposited over the whole surface. Then, the protective insulating film 28 provided on the pad electrode 26 is selectively removed by etching, thereby forming an opening (a pad opening) on the pad electrode 26. At this time, the etching is stopped with the surface of the barrier film 27 exposed.

Figure 9A:
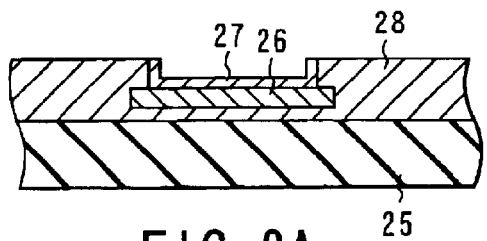
FIGS. 9A and 9B are sectional views illustrating the steps according to a variant of the third embodiment.
Figure 9B:
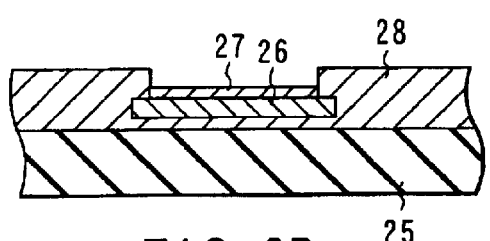

Examples of another method for forming a structure in which the barrier film 27 is present on the bottom of the pad opening include a method for forming a pad opening, then forming a TiN film acting as the barrier film 27 by an ordinary sputtering or CVD method, or an anisotropic sputtering or CVD method, thereby removing the unnecessary TiN film provided on the protective insulating film 28 by CMP. FIG. 9A shows a structure obtained by using the ordinary sputtering or CVD method, and FIG. 9B shows a structure obtained by using the anisotropic sputtering or CVD method.

Figure 8C:
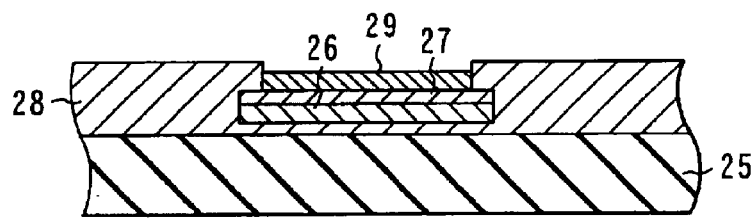

As shown in FIG. 8C, subsequently, Ni particles having a diameter of 1 to 2 μm or less are selectively deposited on the barrier film 27, thereby forming a Ni fine particle film 29. Sectional views of FIG. 8C and succeeding drawings show a region C of FIG. 8B. A specific method for forming the Ni fine particle film 29 is as follows.

More specifically, Ni fine particles previously formed by using an evaporating method are introduced into a chamber having a semiconductor substrate 20 housed therein and having a lower pressure than a carrier gas, desirably a carrier gas containing a reducing gas (for example, a gas containing hydrogen) by means of the gas. By utilizing a difference between the pressure of the gas and the internal pressure of the chamber, the gas is sprayed on the surface of the semiconductor substrate 20 with high rectilinearity to deposit the Ni fine particles. Thus, the Ni fine particle film 29 is formed.

Figure 10A:
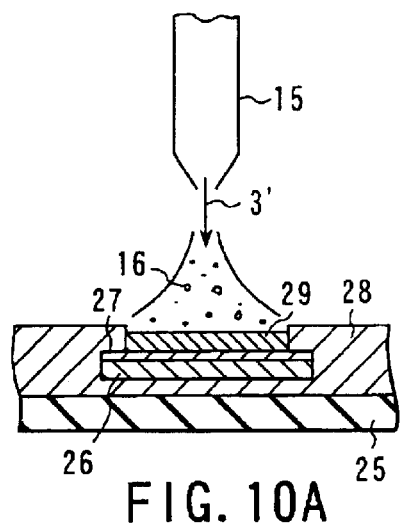
FIGS. 10A to 10C are views showing an example of a fine particle exhaust nozzle to be used in the third embodiment.

At this time, the Ni fine particle film 29 is deposited on a desired pad electrode 26 with an area having a diameter of about 50 μm, for example, through the barrier film 27 by using a pencil type fine particle exhaust nozzle 15 having a nozzle exhaust diameter of about 50 μm, for example, as shown in FIG. 10A in such a manner that the Ni fine particles can be deposited like a dot with a diameter which is equal to or smaller than the size of the pad electrode 26.

Figure 10B:
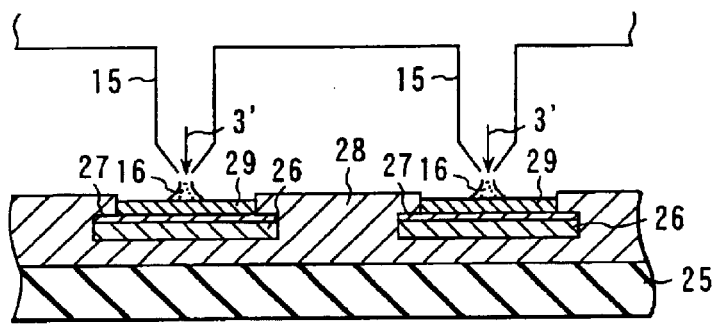
Figure 10C:
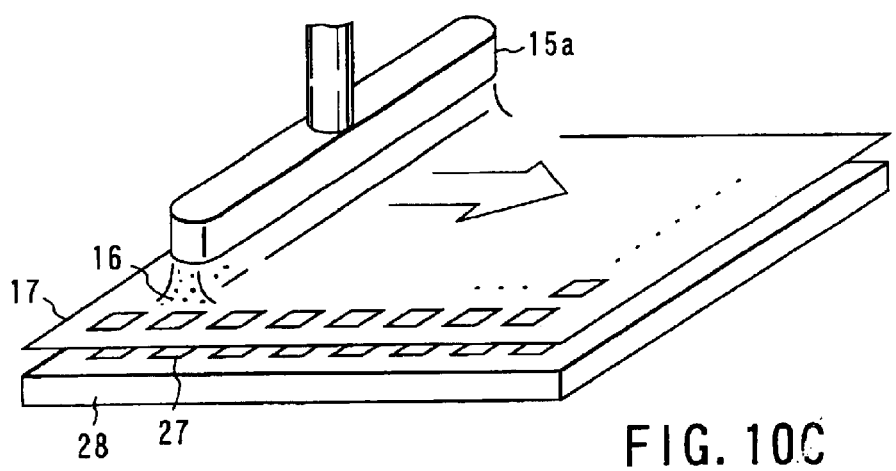

As shown in FIG. 10B, a plurality of fine particle exhaust nozzles 15 may be used. As shown in FIG. 10C, moreover, a mask 17 is provided between the fine particle exhaust nozzle 15a capable of exhausting the Ni fin particles like a line or a face and the semiconductor substrate 20. The fine particle exhaust nozzle 15a is caused to scan the whole surface of the substrate while exhausting the Ni fine particles. Thus, the Ni fine particle film 29 can be deposited and formed on the desired pad electrode 26.

Examples of other methods for forming the Ni fine particle film 29 include a method for forming a Ni fine particle 16 by arc discharge and depositing the Ni fine particle 16 on the surface of the barrier film 27, thereby forming the Ni fine particle film 29, for example.

Also in this case, the Ni fine particle 16 is formed in a gas including a reducing atmosphere. Consequently, the Ni fine particle film 29 having high adhesion can be deposited and formed on the barrier film 27. As a matter of course, high adhesion can also be obtained by the method for forming the Ni fine particle film 29 described above.

Figure 8D:
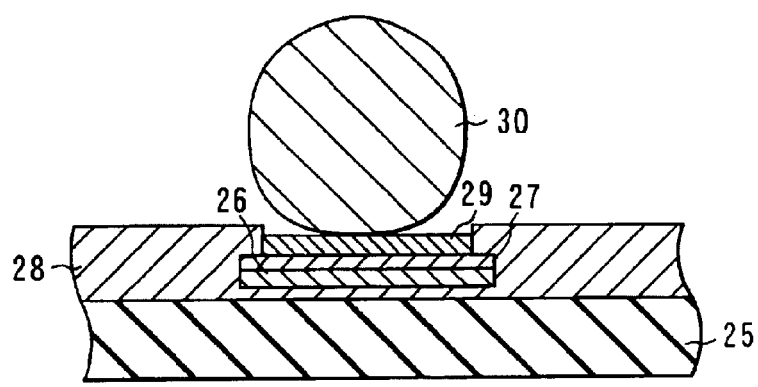

As shown in FIG. 8D, next, a bump electrode 30 made of a solder ball is provided on the pad electrode 26 through the Ni fine particle film 29.

Figure 8E:
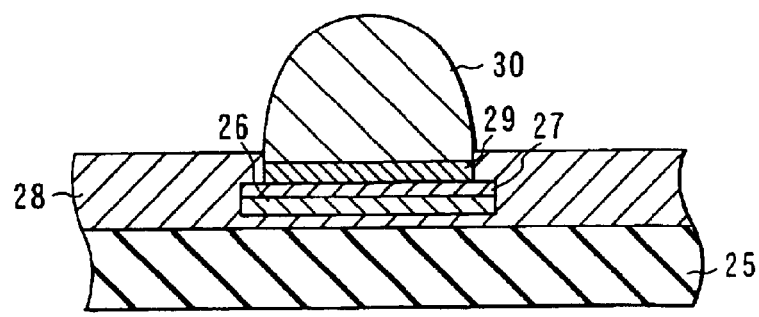

As shown in FIG. 8E, finally, the bump electrode 30 is melted by a heat treatment, thereby joining the Ni fine particle film 29 to the bump electrode 30. Thus, a bump electrode structure is formed.

It is preferable that the heat treatment should be performed in the reducing atmosphere. The reason is that a natural oxide film of the Ni fine particle film 29 and a natural oxide film of the bump electrode 30 are removed, resulting in an enhancement in the adhesion of the bump electrode 30 to the Ni fine particle film 29 and the adhesion of the Ni fine particle film 29 to the protective film (TiN film) 28.

Moreover, the Ni fine particle film 29 and the natural oxide film of the solder ball 30 can also be removed by a heat treatment in a vacuum atmosphere and an inactive gas atmosphere such as a $N_2$ atmosphere, an Ar atmosphere or the like. The natural oxide film can effectively be removed by performing the heat treatment under a pressure reduction.

Furthermore, the natural oxide film of the Ni fine particle film 29 can be removed by a heat treatment to be performed in a vacuum at a temperature of about 150° or more. Therefore, the solder ball 30 can also be dissolved after the heating is fully performed at a temperature which is less than the melting point of the solder ball 30.

In the conventional method, the adhesion of the solder ball to the TiN film (barrier film) is poor. Therefore, after the TiN film is removed by RIE at the time of the formation of the pad opening, lamination films having a Ti film, an Ni film and a Pd film as a barrier film, an adhesion film and an antioxidant film are continuously formed by using a sputtering method, for example.

According to the present embodiment, however, the TiN film (barrier film) 27 is caused to remain at the time of the formation of the pad opening, and can be used as the barrier film of the solder ball. Therefore, the process can be simplified.

In general, there has been known that the fine particles have active surfaces and are easily reacted at a lower temperature than a reaction temperature in an equilibrium state differently from the contact of bulk materials.

Accordingly, the reaction is performed more easily at the same temperature by using the Ni fine particle film 29 for the adhesion layer to the solder ball 30 than by using a conventional adhesion layer (for example, a Ni layer). If a reaction amount having the same extent is enough, a heat treating temperature can be more reduced.

Fourth Embodiment

FIG. 11 is a sectional view showing the steps of a method for forming a bump electrode structure according to a fourth embodiment of the present invention, which is a sectional view corresponding to the region C of FIG. 8B.

Figure 11A:
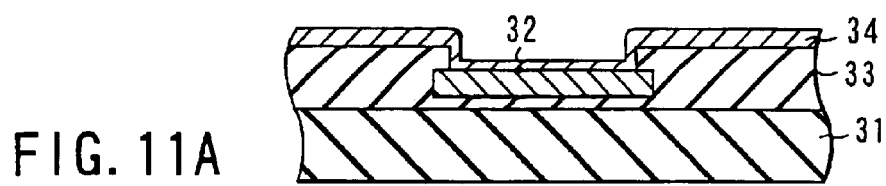
FIGS. 11A to 11E are sectional views showing the steps of a method for forming a bump electrode structure according to a fourth embodiment of the present invention.

First of all, as shown in FIG. 11A, an interlayer dielectric film 31 is formed, according to a known method, on a semiconductor substrate 30 where an element and the like (not shown) are formed, and subsequently, a pad electrode 32 made of Al, for example, is formed on the interlayer dielectric film 31. A wiring which is not shown exists in the interlayer dielectric film 31.

As shown in FIG. 11A, next, a protective insulating film 33 is deposited over the whole surface. Then, the protective insulating film 33 provided on the pad electrode 32 is selectively removed by etching, thereby forming an opening (a pad opening) on the pad electrode 32. Then, a barrier film 34 made of TiN is deposited over the whole surface as shown in FIG. 11A.

Figure 11B:
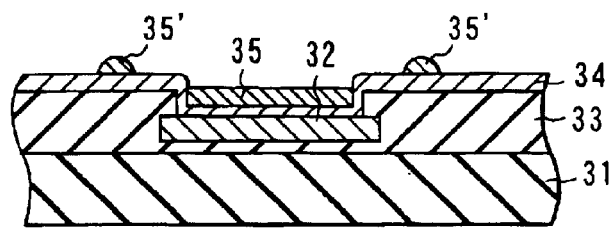

As shown in FIG. 11B, subsequently, a Ni fine particle film 35 is selectively formed on the bottom of the pad opening by the method described in the first embodiment.

In the drawing is shown a state in which the selective formation of the Ni fine particle film 35 is incompletely performed and a Ni fine particle film 35' is also formed on the barrier film 34 other than the pad opening.

Figure 11C:
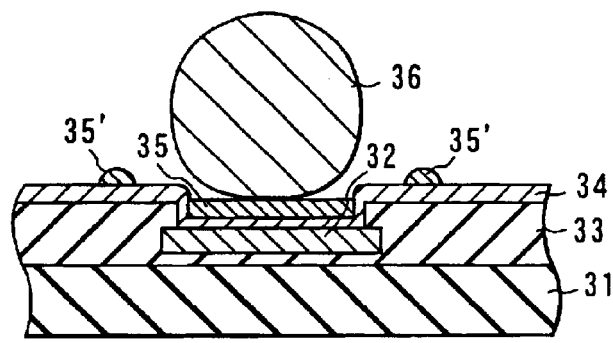

As shown in FIG. 11C, next, a bump electrode 36 made of a solder ball is provided on the pad electrode 32 through the barrier film 34 and the Ni fine particle film 35.

Figure 11D:
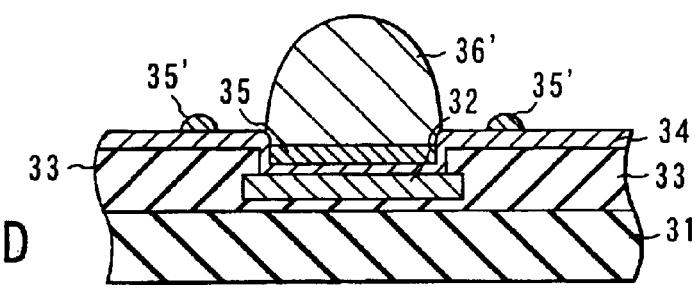

As shown in FIG. 11D, then, the bump electrode 36 is melted by a heat treatment, and the Ni fine particle film 35 and the bump electrode 36 are joined together, thereby forming a bump electrode structure in the same manner as in the first embodiment.

Figure 11E:
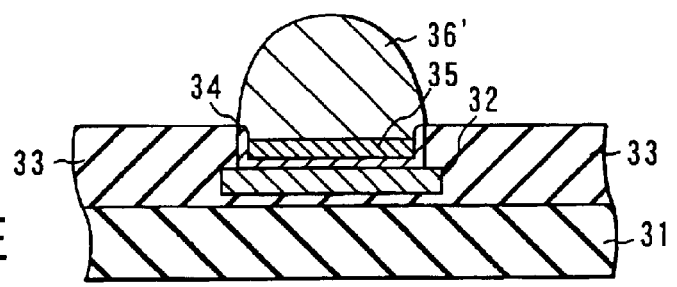

As shown in FIG. 11E, thereafter, the unnecessary barrier film (TiN film) 34 existing between the pad electrodes is removed by using the bump electrode 36 as a mask. As a result, the Ni fine particle film 35' formed on the barrier film 34 other than the pad opening is removed together with the unnecessary barrier film 34 at the time of the formation of the Ni fine particle film 35. Consequently, also in the case where the pad electrode 32 becomes finer, a short circuit between the pad electrodes can be prevented.

The barrier film (TiN film) 34 is removed by wet etching using a mixed solution containing $NH_4OH$, $H_2O_2$ and $H_2O$, for example.

In the case of lift-off using the wet etching, there is a possibility that a substrate wiring layer might be damaged by the wraparound of drugs. In order to prevent such a drawback, it is sufficient that the barrier film (TiN) film 34 is not largely formed on the side wall of the pad opening in such a manner that the top of the substrate wiring layer can fully be covered with the bump electrode.

Figure 12:
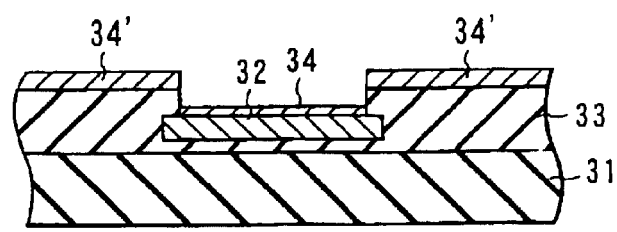
FIG. 12 is a sectional view illustrating a variant of the fourth embodiment.

More specifically, a barrier film 34' having a structure shown in FIG. 12 is formed by a film forming method in which a barrier film (TiN film) 24 is not largely formed on the side wall, for example, an anisotropic film forming method in such a manner that the top of the wiring is fully covered with the bump electrode.

Examples of another method include a method for selectively removing the unnecessary barrier film (TiN film) 34 by RIE using a gas system capable of selectively removing TiN by etching with the bump electrode 36 used as a mask.

As yet another method, first of all, a resist pattern for covering the bump electrode 36 is formed, the unnecessary barrier film (TiN film) 34 is then removed by the RIE using the resist pattern as a mask, and the resist pattern is thereafter taken away.

Fifth Embodiment

The present embodiment is different from the above-mentioned embodiments in respect of a heat treating step to be performed after a solder ball is formed.

More specifically, a semiconductor substrate is housed in a vessel in a vacuum atmosphere or an inactive gas atmosphere such as a $N_2$ gas atmosphere, an Ar gas atmosphere or the like, a heat treating temperature is held at a temperature that is equal to or higher than a temperature at which the natural oxide film of a Ni fine particle film is removed and that is equal to or lower than the melting point of the solder ball. After the natural oxide film of the Ni fine particle film is removed, the heat treating temperature is raised to the melting point of the solder ball to join the Ni fine particle film to the solder ball. Thus, a bump electrode is formed.

By performing the step of removing the natural oxide film of the Ni fine particle film and the step of forming the bump electrode in the same atmosphere by means of the same vessel, the process can be shortened.

As a matter of course, the step of removing the natural oxide film of the Ni fine particle film and the step of forming the bump electrode may be performed in separate vessels (devices), respectively. In this case, a substrate is carried without breaking a vacuum.

The natural oxide film of the Ni fine particle film may be removed at the same time during the formation of the Ni fine particle film (in this case, the formation of the Ni fine particle film is also performed in the same vessel), or after the formation of the Ni fine particle film (in this case, the formation of the Ni fine particle film is performed in the same vessel or a separate vessel).

Figure 13:
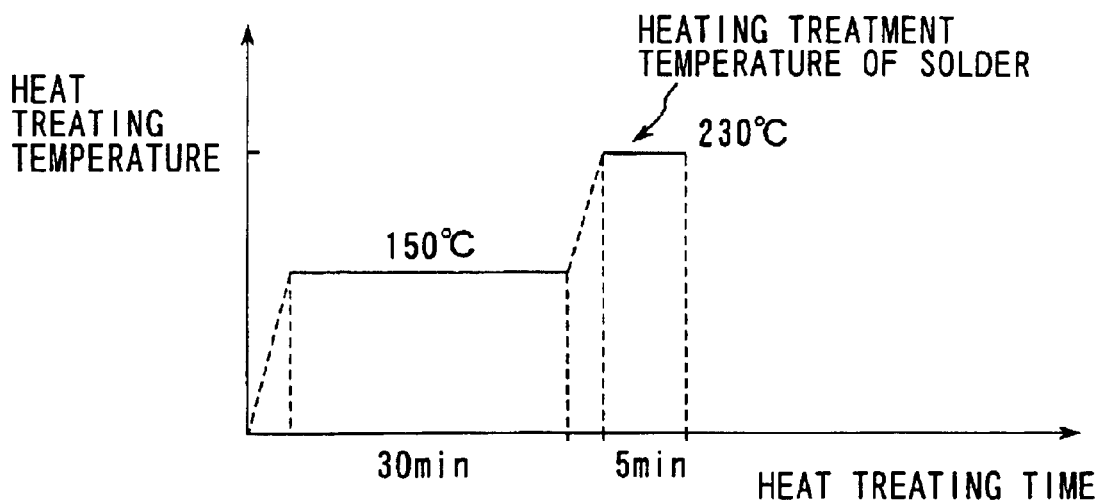
FIG. 13 is a chart showing a relationship between a heat treating time and a heat treating temperature at a heat treating step according to the fourth embodiment.

FIG. 13 shows a specific relationship between a heat treating time and a heat treating temperature at the heat treating step. Although the temperature that is equal to or higher than the temperature at which the natural oxide film of the Ni fine particle film is removed and that is equal to or lower than the melting point of the solder ball also depends on the solder composition of the solder ball, it is equal to or higher than about 150° C. and is lower than 183° C. in the case where an eutectic solder is used. The natural oxide film of the Ni fine particle film can be removed more effectively at the same heat treating temperature in a reducing gas atmosphere in place of the inactive gas atmosphere.

FIG. 19 shows a temperature dependency in the heat treating atmosphere of a Ni nitride amount for the Ni fine particle film, indicating the rate of a Ni oxide amount for a Ni fine particle amount which is obtained by performing the heat treatment, wherein a Ni oxide amount for an initial Ni fine particle before the heat treatment is set to 1.

In the drawing, a white circle represents the rate of the Ni oxide amount obtained when the heat treatment is performed at a degree of vacuum of $5 \times 10^{-8}$ Torr or less and a black circle represents the rate of the Ni oxide amount obtained when the heat treatment is performed in an atmosphere with a steam partial pressure of $152 \times 10^{-3}$.

As is apparent from the drawing, if the same temperature is set, more Ni oxide can be removed by the heat treatment in the reducing atmosphere than the heat treatment in the vacuum. Moreover, it is apparent that more Ni oxide can be removed at a lower temperature by the heat treatment in the reducing atmosphere than the heat treatment in the vacuum when the same amount of Ni oxide is to be removed. Furthermore, it has been confirmed that the Ni oxide film can be removed at a temperature of 280° C. in an amount shown by a black square in the drawing by selecting a proper heat treating time and a hydrogen partial pressure.

A surface treatment is carried out by such a heat treatment in the reducing atmosphere. Consequently, it is possible to remove sufficient Ni oxide at a temperature which is equal to or lower than a temperature necessary for the step of melting and bonding a solder. More specifically, as in the present embodiment, the heat treating step for removing the oxide film provided on the surface of the fine particle film and the heat treating step for melting and connecting the solder ball can be continuously carried out by simply changing the heat treating temperature in the same device, and, as a matter of course, it can be performed in chambers having different heat treating temperatures, for example.

Sixth Embodiment

The present embodiment is different from the above-mentioned embodiments in respect of a method for forming a Ni fine particle film.

At the step of forming a Ni fine particle film on a barrier film (TiN film) by deposition, a Ni fine particle film having a high density is formed by deposition in the early stage and a Ni fine particle film having a low density is subsequently formed by deposition.

More specifically, the kinetic energy of Ni fine particles colliding with a substrate is changed by the following method, thereby forming, by deposition, a Ni fine particle film having a density gradient in which the density of the Ni fine particles is continuously reduced as the Ni fine particle film is more deposited on the barrier (TiN) film.

Alternatively, the kinetic energy of the Ni fine particles colliding with the substrate is changed by the following method, thereby forming, by deposition, a Ni fine particle film having a density gradient in which the density of the Ni fine particles is discontinuously reduced as the Ni fine particle film is more deposited on the barrier (TiN) film. In other words, there is formed, by deposition, the Ni fine particle film having a lamination structure having at least two layers with different densities in which a portion closer to the barrier film (TiN film) has a higher density.

The kinetic energy of the Ni fine particles colliding with the substrate is controlled in the following manner.

More specifically, the Ni fine particles are formed, thereby continuously or intermittently changing a distance between a nozzle for exhausting the Ni fine particles and the substrate. If the distance is smaller, the kinetic energy loss of the Ni fine particle is more reduced. Therefore, the kinetic energy of the Ni fine particles colliding with the substrate is great. Thus, a Ni fine particle film having a higher density can be formed by deposition.

As another effective method, a gas pressure at which the fine particles are exhausted from the nozzle is changed continuously or intermittently. If the gas pressure is higher, the kinetic energy of the Ni fine particles colliding with the substrate is more increased. Consequently, a Ni fine particle film having a higher density can be formed by deposition.

As yet another method, a magnetic field is formed between the nozzle and the substrate, and the intensity of the magnetic field is controlled. If the intensity of the magnetic field is higher, the Ni fine particles receive greater force so that the kinetic energy of the Ni fine particles colliding with the substrate is more increased. Consequently, a Ni fine particle film having a higher density can be formed by deposition. A method utilizing the magnetic field will further be described in a ninth embodiment.

Subsequent steps are the same as in the above-mentioned embodiments.

According to the present embodiment, the density of the Ni fine particle film on the side in contact with the barrier film (TiN film) is high. Therefore, the contact area of the barrier film (TiN film) with the Ni fine particle film is increased. Consequently, the adhesion strength of the barrier film (TiN film) to the Ni fine particle film is increased.

On the other hand, the density of the Ni fine particle film on the side in contact with the solder ball is low. At the step of dissolving the solder ball to form the bump electrode, therefore, the melted solder easily enters the Ni fine particle film so that the contact area of the bump electrode with the Ni fine particle film is increased. Consequently, the adhesion strength of the bump electrode to the Ni fine particle film is increased.

Seventh Embodiment

FIG. 14 is a sectional view showing the steps of a method for forming a bump electrode structure according to a seventh embodiment of the present invention.

Figure 14A:
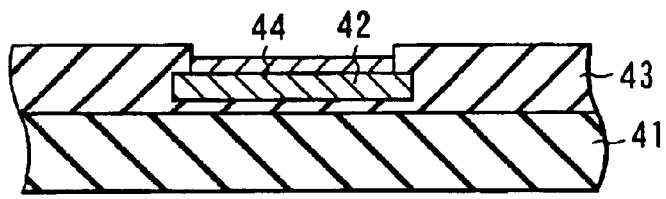
FIGS. 14A to 14C are sectional views showing the steps of a method for forming a bump electrode structure according to a seventh embodiment of the present invention.

As shown in FIG. 14A, first of all, a pad electrode 42 made of Al, for example, is formed on an interlayer dielectric film 41 having the same multilayer interconnection as in the third embodiment of FIG. 8 formed thereon. A semiconductor substrate (not shown) having an element formed as in the third embodiment is present under the interlayer dielectric film 41.

As shown in FIG. 14A, next, a protective insulating film 43 is deposited, and the protective insulating film 43 provided on the pad electrode 42 is selectively removed by etching. Thus, an opening (a pad opening) is formed on the pad electrode 42.

As shown in FIG. 14A, subsequently, an adhesion/barrier film 44 made of fine particles or a film 44 serving as both of them is selectively formed by deposition on the bottom of the pad opening.

It is also possible to use an adhesion/barrier film made of Ti fine particles, $NiTi_x$ alloy fine particles or $NiTi_x$ mixed fine particles in place of Ni fine particles.

It is apparent that the adhesion/barrier film made of the Ti fine particles, the $NiTi_x$ alloy fine particles or the $NiTi_x$ mixed fine particles as well as the Ni fine particles described in the above-mentioned embodiments may be used or the film serving as both of them may be used, or a plural kinds of fine particles may be combined.

Furthermore, it is also possible to use an adhesion/barrier film made of at least one of fine particles selected from a fine particle group comprising the Ni fine particles, the Ti fine particles, the $NiTi_x$ alloy fine particles and the $NiTi_x$ mixed fine particles and at least one of fine particles selected from another fine particle group. In this case, the forming method described in the first embodiment, for example, is used for a method for forming an alloy fine particle film and a mixed fine particle film.

Figure 14B:
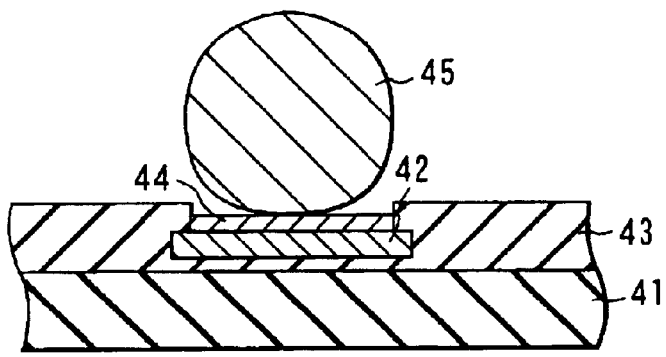

As shown in FIG. 14B, next, a bump electrode 45 made of a solder ball is provided on the pad electrode 42 through the adhesion/barrier film 44.

Figure 14C:
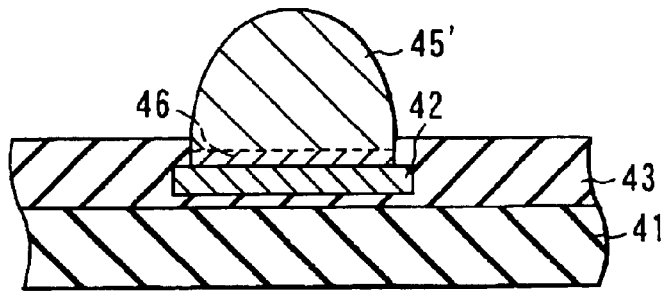

As shown in FIG. 14C, finally, the bump electrode 45 made of the solder ball is melted by a heat treatment, the adhesion/barrier film or the film 44 serving as both of them is joined to the bump electrode 45. Thus, a bump electrode structure is completed. In the drawing, the reference numeral 46 denotes a conductive layer obtained by the reaction of the adhesion/barrier film 45 with the bump electrode 45.

Also in the present embodiment, the same effects as in the third embodiment can be obtained. According to the present embodiment, furthermore, it is not necessary to previously form a barrier film. Therefore, the number of steps can be more reduced.

Also in the case where a gold ball is used in place of the solder ball, a Au ball can be provided on the adhesion/barrier film 44, thereby performing melting connection. At this time, the Au ball is not oxidized. Therefore, it is sufficient that the step of pressure welding and melding the Au ball and the adhesion layer, the barrier film or the film 44 serving as the adhesion layer and the barrier film is carried out after a natural oxide film made of the fine particles is removed.

Moreover, in the case where the Au ball is combined with an Al wiring (a substrate wiring), gold and Al are alloyed so that an alloy layer is formed. Therefore, it is possible to prevent the gold from being diffused into an insulating film in the Al wiring and around the Al wiring. Under the existing conditions, therefore, the barrier film is not used.

However, if a Au ball having a diameter of several tens nm, for example, is formed, a very small amount of gold is actually diffused. Such gold diffusion makes troubles together with an increase in the fineness of the element. Also in such a case, the barrier film made of the fine particles described above can be used.

Eighth Embodiment

The present embodiment is different from the above-mentioned embodiments in respect of a method for forming a Ni fine particle film. More specifically, the present embodiment is characterized in that a paste (a Ni fine particle paste) having Ni fine particles dispersed therein is used as a Ni fine particle film.

More specifically, a pad opening is first formed. Then, the Ni fine particle paste is applied to the whole surface of a substrate. Thereafter, the Ni fine particle paste is subjected to patterning, thereby removing the Ni fine particle paste in a region other than the pad opening. Subsequently, a solder ball is provided on the Ni fine particle paste (a Ni fine particle film) over the pad opening.

The patterning of the Ni fine particle paste may be performed after the solder ball is provided. In this case, however, there is a possibility that the solder ball might be damaged by the patterning. Therefore, it is preferable that the patterning should be performed before the solder ball is provided.

Moreover, if the Ni fine particle paste is applied by screen printing, the application and the patterning can be performed at the same time. Therefore, the steps can be shortened.

Furthermore, the Ni fine particle paste may be a burning type or a curing type.

It is preferable that a treating temperature should be 450° C. or less in such a manner that the Ni fine particle paste becomes a conductive Ni fine particle film after a burning treatment or a curing treatment is carried out.

For example, if the diameter of the Ni fine particle is 0.1 $\mu m\phi$ or less, it is possible to obtain conductiveness by the burning treatment and the curing treatment at a temperature of 450° C. or less. Moreover, also in the case where a vacuum atmosphere and a reducing atmosphere, for example, a hydrogen atmosphere are used as a burning treatment atmosphere and a curing treatment atmosphere, the treating temperatures for the burning treatment and the curing treatment can be lowered and the conductiveness can be obtained at a temperature of 350° C., for example. By performing the burning treatment or the curing treatment at a temperature of 450° C. with the atmosphere controlled, it is possible to obtain a Ni fine particle film having a lower resistivity than in the case where the atmosphere is not controlled.

As a method for applying (forming) the Ni fine particle paste, moreover, dipping can also be used in addition to the above-mentioned screen printing. If the Ni fine particle paste has a Ni fine particle diameter of 0.1 $\mu m\phi$ or less, patterning of 1 $\mu m$ or less can be carried out.

Examples of other methods include a spin coating method. In this case, however, a viscosity should be regulated. In the case where the Ni fine particle paste is applied over the whole surface of the substrate as in a spin coater, there is a possibility that the burning treatment or the curing treatment might cause the Ni fine particle film (Ni fine particle paste) to be peeled off because the coefficient of thermal expansion of the Ni fine particle paste is different from that of the substrate. Therefore, it is desirable that the patterning should be carried out before the burning treatment or the curing treatment.

If the dispersion paste having a polarity (+ or −) is used, the dispersion paste can initially be formed selectively on the bottom of the pad opening by applying a voltage having a reverse polarity to the above-mentioned polarity to the pad electrode.

At the subsequent steps, a solder ball is provided on the pad electrode and is then melted by a heat treatment, and the Ni fine particle film is joined to the solder ball, thereby forming a bump electrode in the same manner as in the other embodiments. The heat treating step may be carried out simultaneously with the burning step.

While the Ni fine particle paste has been used for the adhesion layer to the solder ball and the pad electrode in the present embodiment, it can also be used as an embedded metal material of a connecting hole such as a contact hole, a through hole or the like.

Ninth Embodiment

FIG. 15 is a sectional view showing the steps of a method for manufacturing a chip for a multi-chip semiconductor device according to a ninth embodiment of the present invention. The present embodiment is characterized in that a fine particle film is formed by a film forming method using a solution (a Ni dispersing solution) turbid with Ni fine particles. The case where the film forming method is applied to a through plug will be described below.

Figure 15A:
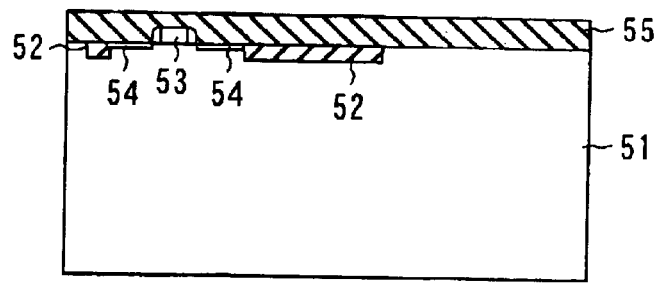
FIGS. 15A to 15D are sectional views showing the steps of a method for manufacturing a chip for a multi-chip semiconductor device according to a ninth embodiment of the present invention.

As shown in FIG. 15A, first of all, an interlayer dielectric film 55 is formed on a silicon substrate 51 where an element such as a MOS transistor is formed. In the drawing, the reference numeral 52 denotes an element isolation film, the reference numeral 53 denotes a gate portion of the MOS transistor (a gate oxide film, a gate electrode, a gate cap insulating film, a gate sidewall insulating film), and the reference numeral 54 denotes a source/drain diffusion layer having an LDD structure.

Figure 15B:
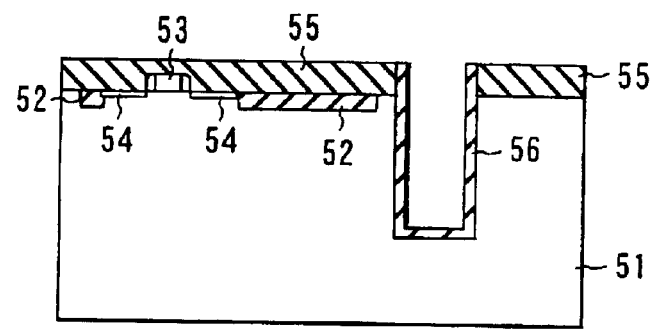

As shown in FIG. 15B, next, the interlayer dielectric film 55 and the silicon substrate 51 are subjected to etching, thereby forming a trench. Then, a uniform thin insulating film 56 is formed on the internal face of the trench.

Figure 15C:
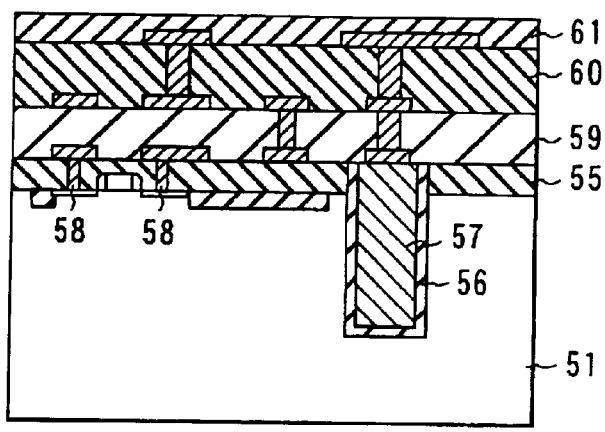

As shown in FIG. 15C, subsequently, a through plug 57 made of Ni fine particles is formed in the trench. A method for forming the through plug 57 is as follows.

First of all, a Ni dispersing solution is applied onto the silicon substrate 51. As the Ni dispersing solution, for example, 10% of Ni fine particles are mixed in a pure water, and ultrasonic waves are irradiated to disperse the Ni fine particles in the pure water. Moreover, the Ni dispersing solution is applied by using a spin coater, for example.

Then, the silicon substrate 51 is heated to a temperature of 80° C., thereby evaporating the water in the Ni dispersing solution. Consequently, a film made of the Ni fine particles (a Ni fine particle film) is formed.

Finally, the silicon substrate 51 is heated in a hydrogen atmosphere at a temperature of 450° C., thereby sintering the Ni fine particles. Thus, the through plug 57 made of the Ni fine particle film is obtained.

If a polycrystalline silicon film is formed as the substrate of the Ni fine particle film at the above-mentioned steps, the through plug 57 made of a Ni silicide film can be formed.

While the Ni fine particles have been used as conductive fine particles, the through plug 57 can be formed by the same method with a metal fine particle having a diameter of 4 $\mu m\phi$ or less.

While the water has been used as a solvent, alcohol and thinner can also be used. The capability of dispersing the conductive fine particles is enhanced in order of water, alcohol and thinner.

Moreover, while the concentration of the conductive fine particles is 10%, it may be higher. As the concentration is raised, the fineness of the film is basically increased. By repeating application and drying, the fineness of the film can be increased.

Although a sintering temperature has been 450° C., a lower sintering temperature is sufficient if the Ni fine particle has a diameter of 0.1 $\mu m\phi$ a or less.

As shown in FIG. 15C, next, a source/drain electrode and a multilayer interconnection are formed according to a known method. In the drawing, the reference numerals 55 and 59 to 61 denote an interlayer dielectric film. Portions shown in different oblique lines in the interlayer dielectric films 55 and 59 to 61 denote a wiring of the multilayer interconnection or a connecting plug 58.

Figure 15D:
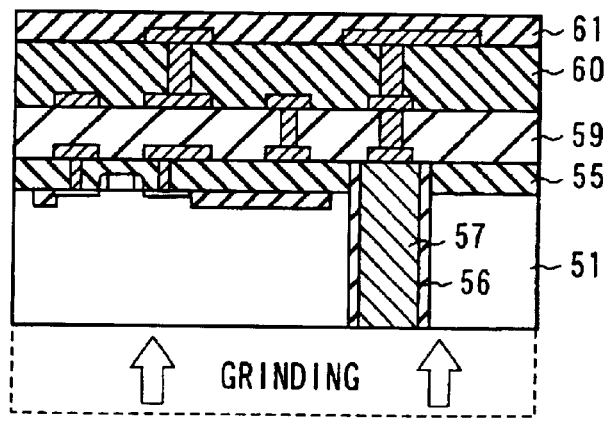

As shown in FIG. 15D, finally, the back face of the silicon substrate 51 is ground, thereby exposing the through plug 57 on the bottom of a trench. Thus, it is possible to finish a chip for a multi-chip semiconductor device having a connecting plug having such a structure that the through plug 57 is embedded in a through hole through an insulating film 56.

Tenth Embodiment

FIG. 16 is a sectional view showing the steps of a method for manufacturing a multi-chip semiconductor device according to a tenth embodiment of the present invention.

Figure 16A:
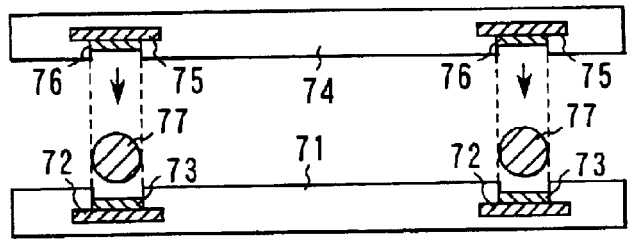
FIGS. 16A and 16B are sectional views showing the steps of a method for manufacturing a multi-chip semiconductor device according to a tenth embodiment of the present invention.

As shown in FIG. 16A, first of all, an element and a wiring (a multilayer interconnection) which are not shown are formed on a first semiconductor substrate 71, and a first pad electrode 72 and a first Ni fine particle film 73 are then formed on the first semiconductor substrate 71 according to the above-mentioned embodiments, for example, the third embodiment. Thus, a chip for a first mulch-chip semiconductor device (which will be hereinafter referred to as a "chip") is finished. Although the first Ni fine particle film 73 is an adhesion layer in the present embodiment, the adhesion layer may be formed after a barrier metal film is formed if the barrier metal film is not formed on a pad electrode.

Similarly, an element and a wiring (multilayer interconnection) which are not shown, and a second pad electrode 75 and a second Ni fine particle film 76 are formed on a second semiconductor substrate 74. Thus, a second chip is finished.

As shown in FIG. 16A, next, a bump electrode 77 made of a solder ball is provided on the Ni fine particle film 73 of the first chip, thereby confirming a position. Then, the Ni fine particle film 76 of the second chip is provided above the first chip through a bump electrode 77.

Figure 16B:
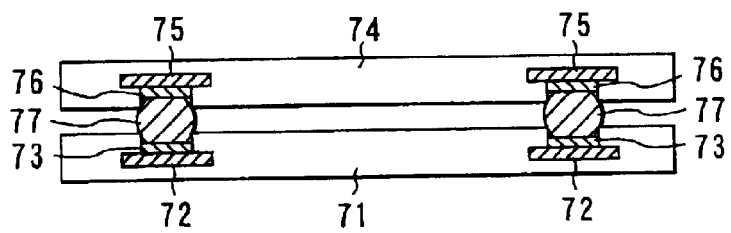

As shown in FIG. 16B, subsequently, the Ni fine particle films 73 and 76 and the natural oxide film of the bump electrode 77 are removed. Then, the bump electrode 77 is melted by a heat treatment, thereby joining (melting and connecting) the Ni fine particle films 73 and 76 to the bump electrode 77. Consequently, the first chip and the second chip are electrically connected to each other.

Figure 17A:
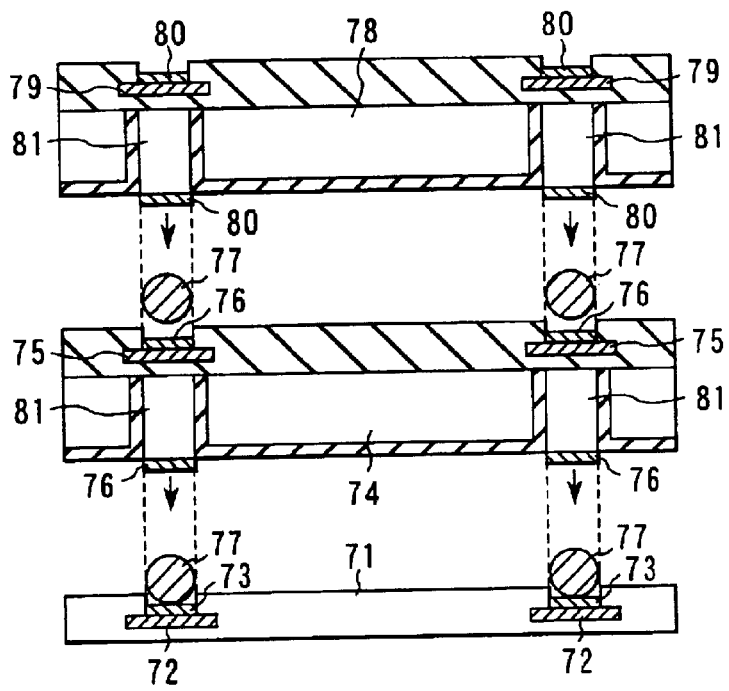
FIGS. 17A and 17B are sectional views showing the steps according to a variant of the tenth embodiment.
Figure 17B:
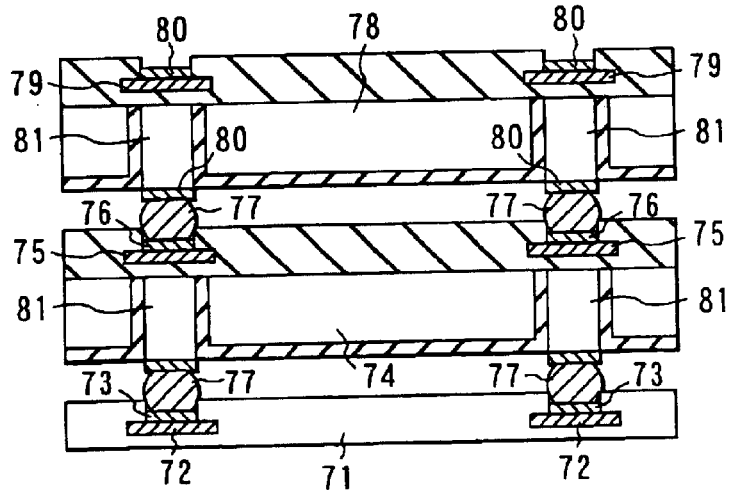
Figure 18A:
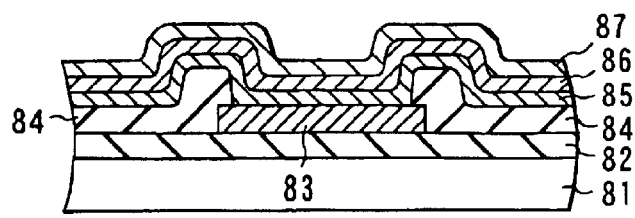
FIGS. 18A to 18E are sectional views showing the steps of a method for forming a bump electrode according to the prior art.
Figure 18B:
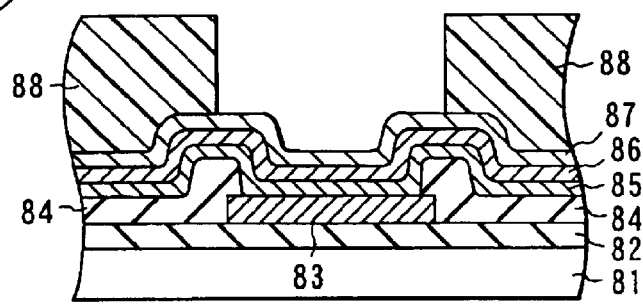
Figure 18C:
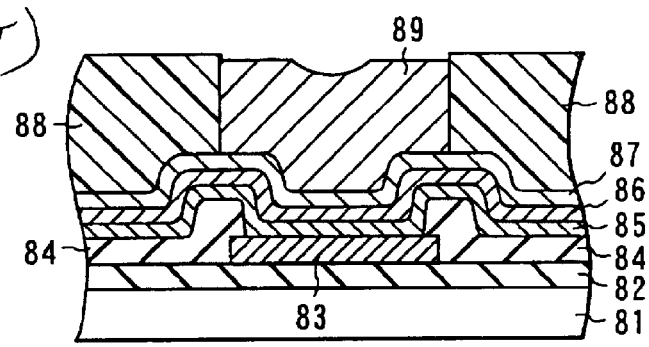
Figure 18D:
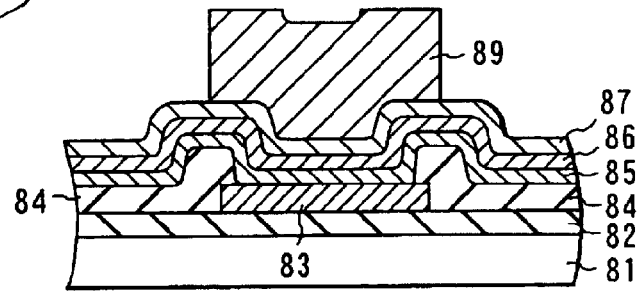
Figure 18E:
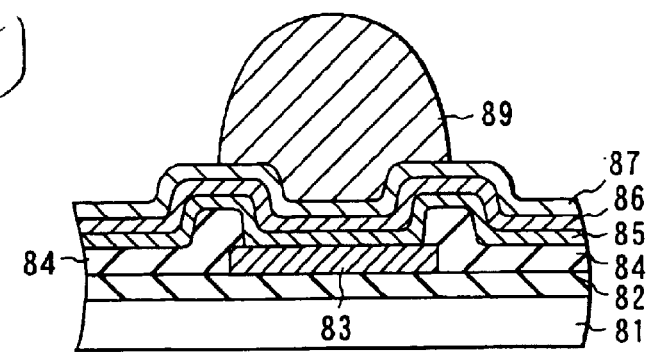

While the case where two chips are connected has been described in the present embodiment, three or more chips can also be connected in the same manner. The chips to be provided have the connecting plug (the insulating film 56 and the through plug 57) shown in FIG. 15. FIG. 17 is a sectional view showing the steps corresponding to FIG. 16 in which three chips are used. In the drawing, the reference numeral 78 denotes a third semiconductor substrate, the reference numeral 79 denotes a third pad electrode, the reference numeral 80 denotes a third Ni fine particle film, and the reference numeral 81 denotes a connecting plug. Herein, there as been described an example in which the connecting plug 81 is provided on the second and third chips.

Eleventh Embodiment

There has been described that examples of the method for forming a Ni fine particle film having a high density include a method for increasing the kinetic energy of the Ni fine particles colliding with the substrate. A method using a magnetic field will further be described below.

FIGS. 20A and 20B are typical views showing the above-mentioned method. As shown, a line of magnetic force (a magnetic field B) is formed in parallel with an axis on which Ni fine particles 16 are exhausted from a fine particle exhaust nozzle. A source for generating a magnetic field may be a permanent magnet or an electromagnet.

In the case where the fine particle exhaust nozzle is provided in such a manner that an axial direction is perpendicular to the surface of a substrate 8, it is further desirable that the axial direction should be set to cause the line of magnetic force to enter perpendicularly to the surface of the substrate 8.

Moreover, it is further desirable that the magnetic field B should be uniform in at least the face of the substrate 8 as shown in FIG. 20A. Alternatively, it is also effective in the formation of a Ni fine particle film having a high density that a local magnetic field B having almost the same size as a film forming spot is formed as shown in FIG. 20B.

Furthermore, in the case where the fine particle has a paramagnetic material or a ferromagnetic material, they are magnetized by the magnetic field B in the same direction as the magnetic field B. At this time, induction magnetic charges are generated in the direction according to the magnetic charges of the source for generating the magnetic field. Therefore, the fine particles receive attraction in the direction of the substrate 8.

In the case where the source for generating the magnetic field is provided below the substrate 8 and the magnetic field B perpendicular to the surface of the substrate 8 is generated, the kinetic energy (collision energy) of the Ni fine particles 16 toward the substrate 8 is increased in order for the Ni fine particles 16 exhausted from the fine particle exhaust nozzle to receive force in the direction of the substrate 8. Consequently, the Ni fine particle film having a high density can be formed on the substrate 8.

Although the magnetic field B turns downward from the substrate 8 in FIGS. 20A and 20B, the same effects can be obtained even if the magnetic field B turns upward from the substrate 8. The reason is as follows. In this case, the fine particles having the paramagnetic material or the ferromagnetic material are magnetized in the same direction as the magnetic field B so that magnetic charges are generated corresponding to the magnetic charges of the source for generating a magnetic field. Therefore, attraction is generated in the direction of the source for generating a magnetic field irrespective of the direction of the magnetic field B.

In the case where an induction coil acting as the source for generating a magnetic field is provided below the substrate 8, the intensity of the magnetic field B can be varied by changing the amount of a flowing coil current on a time basis. In addition, it is also possible to cause the density of the fine particle film to be formed to have a desirable density distribution. It is apparent that the source for generating a magnetic field is provided above the substrate 8 when a material having a predominant diamagnetism is to be formed.

The present invention is not restricted to the above-mentioned embodiments but can variously be changed without departing from the scope of the invention.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A method for forming a fine particle film, comprising:

preparing a substrate;

supplying a gas or medium containing fine particles having a magnetic material to the substrate and forming a magnetic field on the substrate, thereby forming a fine particle film on the substrate; and forming a local magnetic field on the substrate to form a fine particle film on a film forming spot corresponding to the local magnetic field on the substrate.

2. A method for forming a fine particle film according to claim 1, wherein the magnetic material is prepared such that a magnetic field component applied at right angles to a surface of the substrate is more intense than any other magnetic field component.

3. A method for forming a fine particle film according to claim 1, wherein the gas or the medium is supplied to the substrate by means of a nozzle, and a strength distribution of a magnetic field is formed between the nozzle and the substrate, thereby increasing an acceleration of the gas or the medium with respect to the substrate.

4. A method for forming a fine particle film according to claim 3, wherein the strength distribution of the magnetic field has a greater magnetic field on the substrate side than on the nozzle side.

5. A method for forming a fine particle turn according to claim 1, wherein an intensity of the local magnetic field is changed with a passage of time.

6. A method for forming a fine particle film according to claim 1, wherein a size of a region where the local magnetic field is formed is equal to that of a region where the fine particle film is formed.

7. A method for farming a fine particle film comprising the steps of:

preparing a substrate having an electrode;

supplying, to the substrate, a gas or a medium including a fine particle having a polarity; and applying, to the electrode, a voltage having a reverse polarity to the polarity, thereby selectively forming a fine particle film on the electrode.

* * * * *

UNITED STATES PATENT AND TRADEMARK OFFICE
CERTIFICATE OF CORRECTION

PATENT NO. : 6,933,216 B2
DATED : August 23, 2005
INVENTOR(S) : Sakata et al.

It is certified that error appears in the above-identified patent and that said Letters Patent is hereby corrected as shown below:

Column 22,
Line 7, change "turn" to -- film --.
Line 15, change "farming" to -- forming --.

Signed and Sealed this

Eighth Day of November, 2005

JON W. DUDAS
*Director of the United States Patent and Trademark Office*